(12) United States Patent
Bowman et al.

(10) Patent No.: US 9,697,326 B1
(45) Date of Patent: Jul. 4, 2017

(54) TOPOLOGY GRAPH OPTIMIZATION

(71) Applicants: Kelly Eric Bowman, Provo, UT (US); Richard Ryan Watson, Logan, UT (US)

(72) Inventors: Kelly Eric Bowman, Provo, UT (US); Richard Ryan Watson, Logan, UT (US)

(*) Notice: Subject to any disclaimer, the term of this patent is extended or adjusted under 35 U.S.C. 154(b) by 560 days.

(21) Appl. No.: 13/779,498

(22) Filed: Feb. 27, 2013

Related U.S. Application Data (60) Provisional application No. 61/603,595, filed on Feb. 27, 2012.

(51) Int. Cl.
| | | |
|---|---|---|
| G06F 17/50 | (2006.01) |
| G06K 9/46 | (2006.01) |
| G06K 9/68 | (2006.01) |
| G06T 7/60 | (2017.01) |

(52) U.S. Cl.
CPC ......... *G06F 17/5086* (2013.01); *G06K 9/469* (2013.01); *G06K 9/6892* (2013.01); *G06T 7/60* (2013.01)

(58) Field of Classification Search
None
See application file for complete search history.

(56) References Cited

U.S. PATENT DOCUMENTS

| | | | |
|---|---|---|---|
| 5,289,567 A * | 2/1994 | Roth ............................ | 345/420 |
| 5,345,490 A * | 9/1994 | Finnigan et al. ................ | 378/4 |
| 5,633,995 A * | 5/1997 | McClain ................ | G06T 15/10 |
| | | | 345/419 |
| 6,563,500 B1 * | 5/2003 | Kim et al. .................... | 345/423 |
| 6,898,560 B1 * | 5/2005 | Das .................................. | 703/7 |
| 7,003,748 B1 * | 2/2006 | Hsu ..................... | G06F 17/5077 |
| | | | 716/120 |
| 8,346,783 B2 * | 1/2013 | Bai .................. | G06F 17/30539 |
| | | | 707/751 |
| 8,421,798 B2 * | 4/2013 | Rameau et al. ............. | 345/419 |
| 8,620,729 B2 * | 12/2013 | Srinivasa .............. | G06Q 10/04 |
| | | | 705/7.37 |
| 8,730,264 B1 * | 5/2014 | Cornell ........................ | 345/629 |
| 9,201,980 B2 * | 12/2015 | Tealdi ............... | G06F 17/30958 |
| 2001/0039487 A1 * | 11/2001 | Hammersley et al. .......... | 703/2 |
| 2003/0065668 A1 * | 4/2003 | Sowizral et al. ............. | 707/100 |
| 2003/0193528 A1 * | 10/2003 | Stegbauer et al. ............ | 345/853 |
| 2005/0038642 A1 * | 2/2005 | Rameau .................. | G06F 17/50 |
| | | | 704/1 |
| 2008/0069399 A1 * | 3/2008 | Nagao et al. ................. | 382/103 |
| 2009/0295800 A1 * | 12/2009 | Vetter et al. .................. | 345/424 |
| 2010/0278425 A1 * | 11/2010 | Takemoto et al. ............ | 382/173 |
| 2011/0173145 A1 * | 7/2011 | Wu et al. ........................ | 706/13 |

(Continued)

*Primary Examiner* — Kibrom K Gebresilassie
(74) *Attorney, Agent, or Firm* — Workman Nydegger (57) ABSTRACT

Embodiments are presented for topology graph optimization. A design geometry is represented as a graph. Engineering objectives and constraints are associated with a graph representation of a design geometry. The graph representation of the design geometry is iteratively refined for analysis using an optimization algorithm. The graph representation of the design geometry is evaluated according to constraints and objectives associated with the desired resulting design. The optimization results can be further refined by updating objectives and constraints. The optimization results may be machined directly.

20 Claims, 6 Drawing Sheets

(56) References Cited

U.S. PATENT DOCUMENTS

| | | | |
|---|---|---|---|
| 2011/0270589 A1* | 11/2011 | Danna et al. | 703/2 |
| 2012/0029882 A1* | 2/2012 | Bommes et al. | 703/1 |
| 2012/0158369 A1* | 6/2012 | Bachrach et al. | 703/1 |
| 2013/0249909 A1* | 9/2013 | Thompson et al. | 345/420 |
| 2014/0184430 A1* | 7/2014 | Jiang et al. | 341/55 |
| 2014/0324761 A1* | 10/2014 | Yedidia | G06Q 10/04 706/52 |
| 2016/0292220 A1* | 10/2016 | Verma | G06F 17/30454 |
| 2017/0004231 A1* | 1/2017 | Avron | G06F 17/10 |

\* cited by examiner

TOPOLOGY GRAPH OPTIMIZATION

CROSS-REFERENCE TO RELATED APPLICATIONS

This application claims the benefit of Provisional Patent Application No. 61/603,595, entitled "TREE GRAPH FINITE ELEMENT OPTIMIZATION," filed Feb. 27, 2012, which is incorporated herein by reference in its entirety.

BACKGROUND OF THE INVENTION

Design of mechanical and structural systems is a necessary and ubiquitous process. It can be extremely valuable for designers of mechanical parts and systems to optimize the designs before parts are machined, manufactured, or assembled. For example, the designer of a jet engine necessarily wants to design a turbine which has sufficient strength, ideal heat transfer, lift and drag, but with minimal weight. Further, the turbine designer would desire to consider both heat transfer and fluid flow. Further still, the jet turbine must comply with certain other constraints such as size (diameter, length, etc.). In another example, the designer of a bicycle crankset sprocket (gear) also requires sufficient strength to transmit the force of the pedals to the driving rear wheel but also desires the sprocket to have minimal weight so as not to add unnecessarily to the weight of an assembled bicycle. Such determination of a topology to achieve desired strength and weight, and other characteristics for mechanical objects is an important part of design and manufacturing.

In typical product design, a designer must guess what an analyst needs for optimization. Inter-disciplinary communication is problematic at best. A designer might create a preliminary design. A structural, thermal, aero, financial or other analyst might then study the design and might identify problem spots. With feedback from the analysts, the designer would then revise the design based upon the feedback. The revised design is then returned to the analysts for further study. This iterative process involving the designer and analysts can then generally be repeated to improve the design but, in general, is limited by the available time. Each iteration takes time and in a time-constrained design process, the number of refining iterations must necessarily be limited. There is generally insufficient time for more than one or two optimization cycles.

Topology optimization may also be employed to improve and optimize mechanical designs. Topology optimization may produce results which are more nearly optimal, however, the designer must interpret the results of topology optimization which adds steps to the existing process and increases the time necessary for the design and optimization process. Inter-disciplinary communication can still be problematic. Further, in topology optimization, constraints cannot be directly evaluated which require discrete, smooth geometry including but not limited to, stress constraints, manufacturing cost constraints, thermal contact resistance constraints, skin friction drag constraints etc.

In a typical design process using topological optimization, a designer might run a topology optimization. The designer can interpret the results of the topology optimization to create a preliminary design. This preliminary design can be handed off to an analyst to run size optimization and to identify problem spots. As in the design/structural optimization discussed earlier, once problem spots are identified, the designer can revise the design and hand the revised design back to the structural analyst for further analysis. This iterative process can then be repeated until time constraints force the revised design to be released.

BRIEF DESCRIPTION OF AN EXAMPLE EMBODIMENT

In one embodiment of the present invention, a graph representation of a geometric design may be refined for analysis and to produce a refined or optimal design which may be used to manufacture mechanical or structural parts. A method may be performed which includes creating or accessing a representation of a geometric entity, setting or accessing a set of constraints for the geometric entity, and setting or accessing a set of objectives for the geometric entity. A mesh representation of the geometric entity is also created or accessed. A graph representation of the mesh for the geometric entity is created and the graph representation of the geometric entity is refined using an optimization algorithm according to the constraints and objectives for the geometric entity. The graph representation and the mesh may be coupled such that the graph and mesh are both refined during the process.

These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only illustrated embodiments of the invention and are therefore not to be considered limiting of its scope. The invention will be described and explained with additional specificity and detail through the use of the accompanying drawings in which.

DETAILED DESCRIPTION

Embodiments of the present invention may be employed for mechanical topology optimization. Embodiments of the technology described herein may comprise computer-implemented methods, may comprise systems, and may comprise computer program products for implementing methods upon computer systems. Highly refined results for topology optimization may be produced. Less interpretation of results by designers and analysts may be required during the design and optimization process. Embodiments of the present invention may be simpler and faster than previously known methods and systems for optimization. There may be less inter-disciplinary communication problems as each discipline may have more clearly defined roles and responsibilities. Embodiments of the present invention may provide for true stress constraints. Use of embodiments of the present invention may provide for significant savings for the Automotive, Aerospace, and many other industries.

In embodiments of the technology presented herein, a designer may define packaging and other constraints for a mechanical, structural, or geometric artifact. An analyst may also define constraints for the artifact. Innovative topology optimization may be run according to embodiments presented herein which will then produce a usable result. The described topology optimization may require less of the typical design/analysis iterative process, may complete faster, and may produce a result of arbitrary precision. (As used herein, arbitrary precision means that any desired or specified geometric precision for optimization may be achieved.) The resulting usable result may then be released for use.

Figure 1:
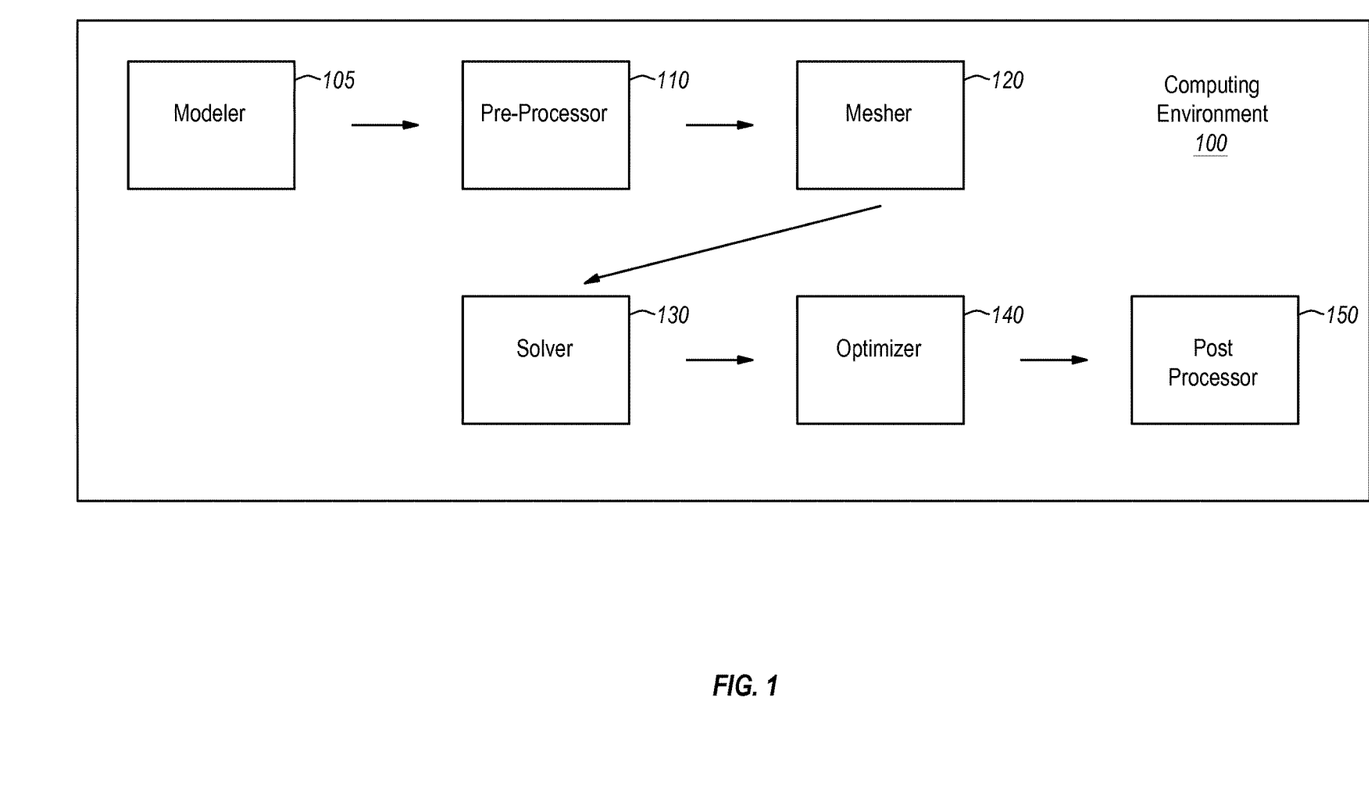
FIG. 1 illustrates an example architecture for a computer system for quad tree optimization.

Embodiments presented herein may be applied to both 2-dimensional (2D) and 3-dimensional (3D) mechanical artifact design and analysis. As illustrated in FIG. 1, embodiments of the present technology might employ a modeler 105, a pre-processor 110, a mesher 120, a solver 130, an optimizer 140 (which implements an optimization algorithm), and a post processor 150.

The Modeler 105: In modeling a mechanical artifact, a 2D or 3D representation of a mechanical artifact is generated.

The pre-processor 110: In pre-processing a model is prepared and its boundary conditions are applied to it. These steps include modeling the packaging (including Maximum and Minimum) volume a part can use up, modeling anywhere a load is applied for a structural part or any boundary conditions required for another analysis. These boundary conditions correspond to the initial conditions of whatever differential equation, system of differential equations, or geometry based optimization objective or constraint will be solved using the finite element method or other geometry-related analysis. In addition to these initial conditions, specifications are set in the form of optimization constraints.

The mesher 120: In the mesher stage a part is given a preliminary mesh. (This is where this technology departs from current topology optimization. In current topology optimization the part is meshed and the design domain is the density of those individual elements.) In embodiments of the technology described herein, a part is meshed in such a way that the mesh can be refined and the amount of mesh refinement along with the element densities is the design domain. Note that this principle can be extended beyond structural topology optimization to any differential equation solved using the finite element method or any other geometry-based analysis The solver 130: In the Solver stage each potential design is evaluated using the finite element method or other geometry based analysis.

The optimizer 140 (which implements an optimization algorithm): An optimization algorithm works directly with a tree-graph that represents a finite element discretization of the design space. The optimizer may employ the solver and invoke the solver 130 iteratively. This algorithm not only optimizes the physical properties of the individual elements, but it can also refine or collapse vertices in the mesh. Because the mesh refinement that this design space allows can produce smooth, discrete designs, true constraints can be applied to the design instead of pseudo constraints applied to non-smooth and non-discrete designs produced by optimization methods that are generally used with prior known systems.

The post processor 150: In post processing, optimization results are viewed and either the optimization problem statement is refined, or a result is selected. If a result is selected, a part could be machined directly using the optimization results as input because it would be smooth and discrete.

Embodiments of the present invention may employ graph representations. Such graph representations may be tree graphs. Such graph representations may be binary trees, quad trees, oct trees, or may be N-trees (where N is a positive finite integer).

Figure 2:
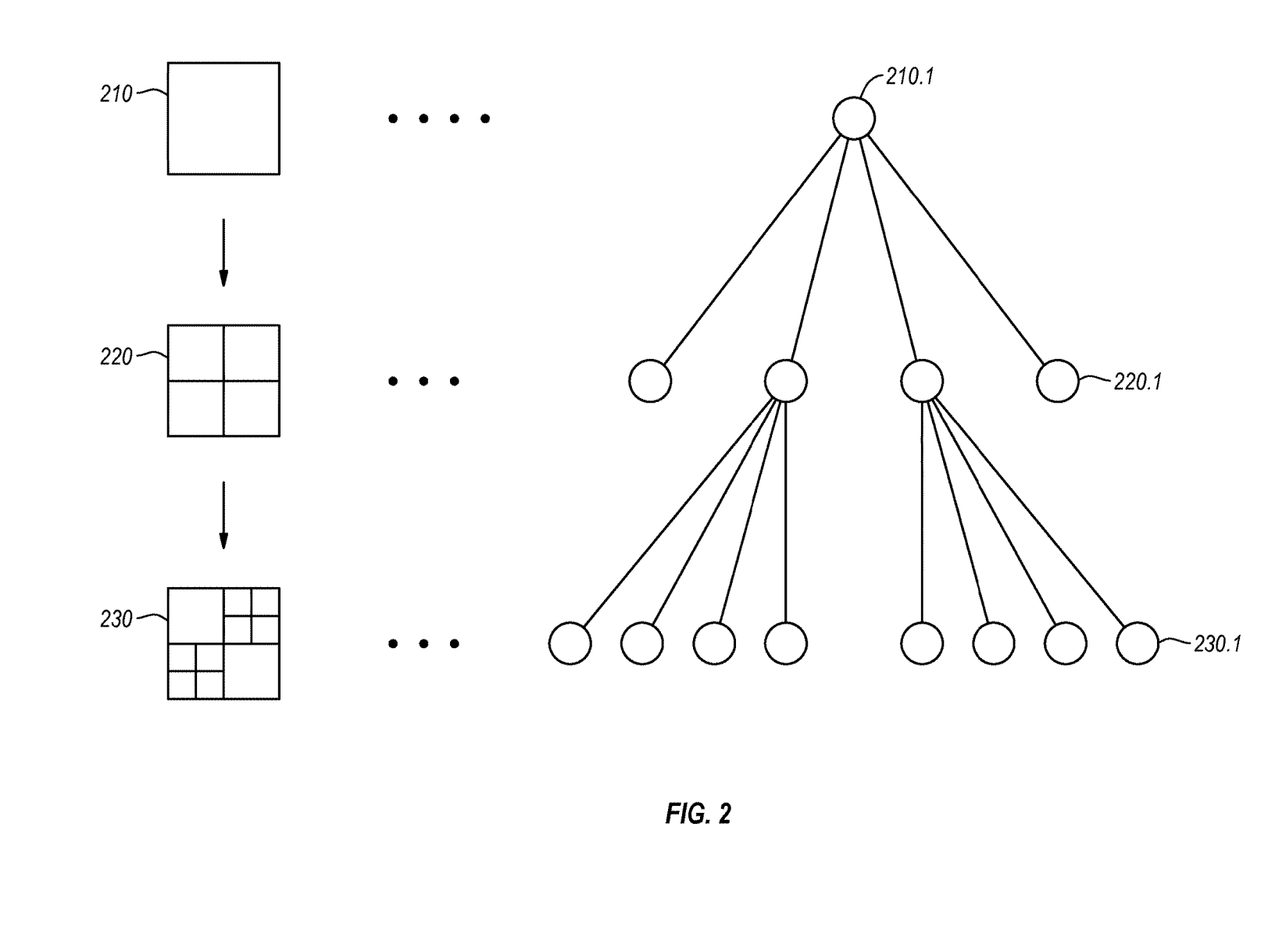
FIG. 2 illustrates a quad tree decomposition of a 2D space.

An example of a quad tree is illustrated in FIG. 2. A quad tree may be used to partition an n-dimensional space by subdividing subregions of the space into four lower subregions. The quad tree of FIG. 2 illustrates a 2-dimensional space. A top level vertices 210.1 represents the top-most region 210. Region 210 is then subdivided into the four subregions 220. The four subregions 220 are represented in a quad tree by the vertices 220.1. In turn, two of the four subregions 220 are further subdivided into four lower-level subregions 230. Similarly, the lower-level subregions 230 are represented in the tree by vertices 230.1.

Figure 3:
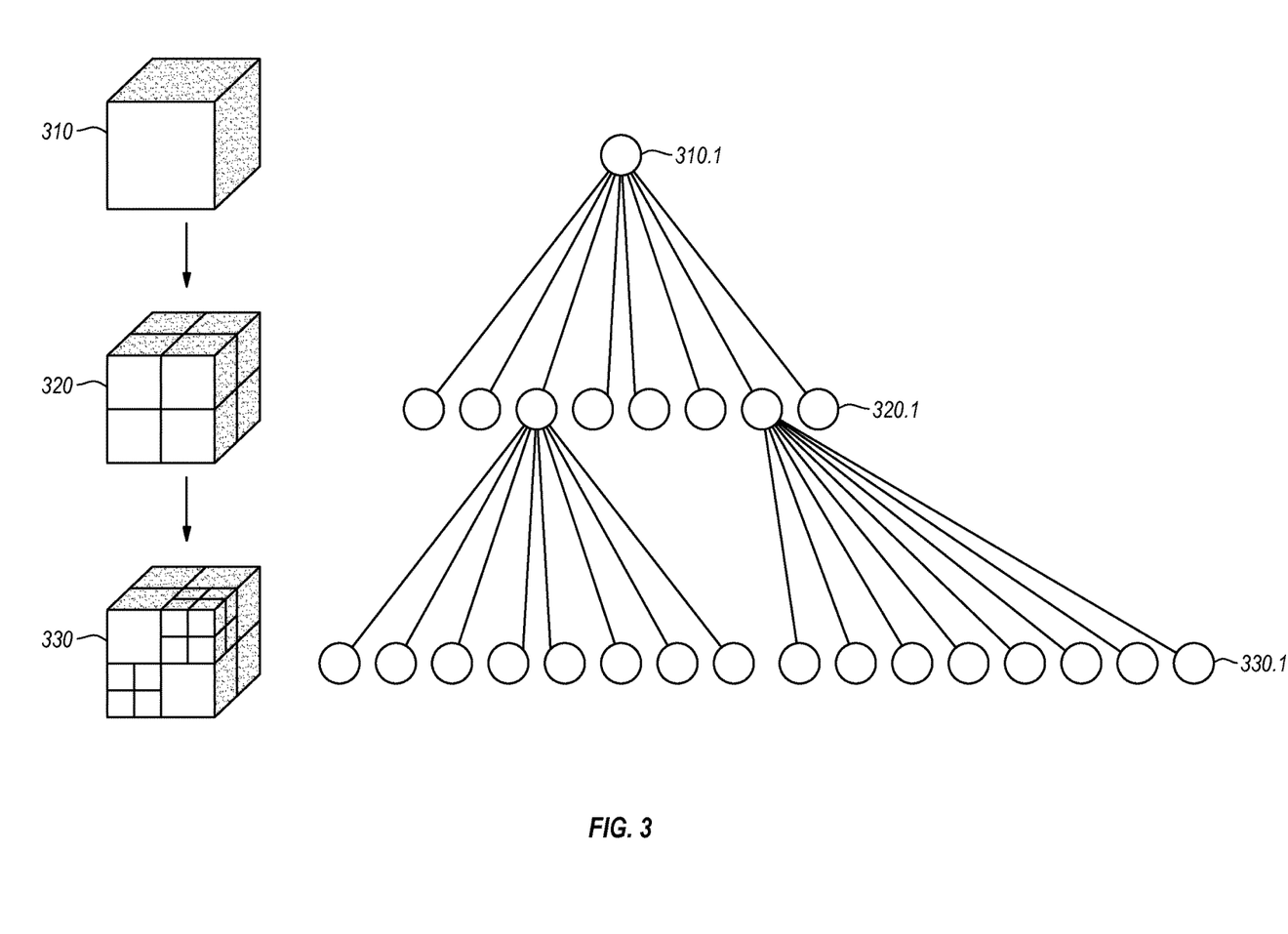
FIG. 3 illustrates an oct tree decomposition of a 3D space.

An example of an oct tree is illustrated in FIG. 3. An oct tree may be used to partition an n-dimensional space by subdividing subregions of the space into eight lower subregions. The oct tree of FIG. 3 illustrates a 3-dimensional space. A top level vertex 310.1 represents the top-most region 310. Region 310 is then subdivided into the eight subregions 320. The eight subregions 320 are represented in an oct tree by the vertices 320.1. In turn, two of the eight subregions 320 are further subdivided into eight lower-level subregions 330. Similarly, the lower-level subregions 330 are represented in the oct tree by vertices 330.1.

As may be appreciated, such graph representations may also be graphs in which vertices within the graph have various numbers of child vertices and may also have cycles. For instance, one vertex in the graph may have 4 children, one vertex may have 2 children, one vertex may have 5 children, etc. The number of children a vertex in the graph may have is therefore arbitrary and the technology described herein can be employed for any such arbitrary graph having vertices with arbitrary numbers of children and arbitrary numbers of cross edges connecting vertices in different regions of the graph.

Topology optimization is a mathematical approach that optimizes material layout within a given design space for a given set of loads and boundary conditions. Although some attempts at topology optimization have been tried, most suffer from critical shortcomings. Element densities in a design space are sometimes represented by a fuzzy set. Because each element within such a design space is given a pseudo density value between 0 and 1, these topology optimization results do not produce a real, solid model. Further still, results are not smooth. Even with discrete topology optimization solvers, the smoothness of optimization results are limited by a mesh size of a design space. Geometry must be both smooth and discrete in order to support many constraints like true stress constraints. Thus, these topology optimization solvers do not support many important constraints.

Embodiments described herein provide that by using a generic quad tree as a design space definition, the design space can be refined until it is smooth. In particular embodiments of the present invention, a user can refine a design until it is as smooth as desired. The tolerances or threshold of "smoothness" may be set such that the result is finer than the capabilities of a given CNC machine or reaches an arbitrary tolerance desired by a given user. Embodiments provide that, by using a generic quad tree as a design space definition, the structural artifact may be subject to true stress and other constraints and the results may be manufactured or machined directly from the result of the optimization process.

In embodiments of the present invention, a quad tree, itself, may represent the design space for a topology optimization process. An optimization process may store quad trees and may expand or collapse vertices within the tree. The optimization process may also set the density of any leaf within the tree to a density of 0 or 1. A structural item represented by the tree. A density of 1 may represent that a node represented by the leaf is present in a structural item represented by the tree.

In other embodiments, densities of leaves within the tree may be some number x, 0<x<1 (so called "fuzzy" densities). In this case, during the optimization process the densities of the leaf vertices, as the design is iteratively refined, may converge to 0 or 1.

Although frequent reference is made of a quad tree, it may be appreciated that a binary tree, a tri-tree, a tet-tree, a quad tree, or other trees may be used. A generic N-tree, where N is a positive integer, may be employed in the process. A quad tree may be a 2-dimenstional (2D) representation and an oct-tree may be a 3-dimensional (3D) representation of a design space. Similarly, a tri-tree may be a 2-dimensional (2D) representation and tet-tree (i.e., tetrahedron) may be a 3-dimensional (3D) representation of a design space. FIG. 2 illustrates a simple example quad tree. FIG. 3 illustrates an example oct-tree representation of a simple design space.

The design space, which is represented by a quad tree, can be discretized and solved using finite element methods. As may be appreciated, discretization may include triangles, tetrahedrons, quads, hexes, and other polygonal and polyhedral forms, etc. This means that any differential equation solved using the finite element method or geometric analysis methods can be optimized to produce a smooth design space and realistic, usable, results. (Such results, in contrast to some methods, are not "fuzzy set" results and are not limited by the smoothness of the original mesh) The representation of the design space by the use of a quad tree is both a novel and a useful aspect of some embodiments of the technology presented herein.

In some embodiments, design space represented by a quad tree may be subdivided as necessary. For example, a design space may be subdivided so that each element of a quad tree contains only one node of a structural artifact. For example, nodes may be placed within a design space because they define a boundary of a geometry according to a tolerance set by a user. The resulting mesh may then be triangulated in order to mesh and balance the quad tree. It may be beneficial that there is only one level difference between adjacent elements of the quad mesh. The quad reduction may define the vertices of the design space and the triangulation may define the elements of the design space.

In some embodiments, the corner of each "square" and any intersections between its side and a neighbor in a mesh representation of a design space may be represented as a node is a tree graph. The tree graph may be a quad graph. Each enclosed smaller "square" in the mesh may be a leaf vertex of the element representing the enclosing square.

In some embodiments, a genetic algorithm may be used to refine the quad tree representation of the structural entity. In using a genetic algorithm, for instance, ten random representations of the quad tree may be chosen at random. The "fitness" of each representation may then be judged. Using random-based tournament selection, three representations may be chosen. Whichever representation is the best fit may be chosen to move on to the next selection. Crossover, which swaps vertices of one representation with corresponding vertices in another representation, and mutation, which randomly expands or collapses vertices in a representation or changes their densities, may be used to derive new representations for further best fit testing and refinement.

It should be noted that, while a genetic algorithm may be employed in some embodiments, other optimization methods may also be used in other embodiments and still keeping within the present invention. Some of the optimization methods which may be used in particular embodiments of the invention include ant colony optimization or other swarm intelligence methods, branch and bound, simulated annealing or other combinatorial optimization algorithms, graph search algorithms (such as Kruskal's algorithm and modifications thereof), lazy search methods, and combinations of any of these and others including Newtonian optimization methods.

For performing crossover, the branches of one tree graph representation may be severed and replaced with the corresponding branch (and children vertices) of another tree graph representation. In this fashion, crossover may be performed with child sub-trees of different tree graphs even though the child sub-trees being swapped may be different and have different numbers of children. Such crossover swaps can then be placed in contention for propagation to another round of selection in an optimization algorithm.

Mutation may be used to randomly expand a vertex into child vertices or to collapse a vertex in a given tree graph. Such random mutations can then be placed in contention for propagation to another round of selection in an optimization algorithm.

In some embodiments, tournament selection may be used to create and/or select parents. Crossover and mutation may then be used to create children. Children may then be ranked according to fitness and tournament selection may then again be used to select the next generation of parents. Because tournament selection favors designs with better fitness, this process will eventually converge to better designs.

An arbitrary threshold for precision may be specified for the precision of a resulting design. For example, the minimum precision of a computer numerical controlled (CNC) machine may be specified as the desired precision of a design. The refinement may then progress until this specified precision is reached. In this fashion, an optimal design which takes advantage of the minimum precision of the CNC machine may be produced (and no unnecessary iterations will be performed in order to create a design which has tolerances or precision which cannot be reproduced by the CNC machine).

Notably, anything which can be approximated with finite elements methods—such as fluid mechanics, heat transfer, structural mechanics, etc.) may be used as objectives for the processes and technology described herein. For example, the processes and technology described herein may be used to optimize structural mechanics such as the weight of a machined part. In another example, the processes and technology described herein may be used to optimize structural mechanics such as a maximum or minimum displacement of a machined part.

In one embodiment of the present invention, a method for refining a graph representation of a geometry for analysis may be performed. The method may be performed in a computing environment which includes one or more computer processors and computer memory and which execute computer-executable instructions which cause the one or more processors to perform the method for refining a graph representation of a geometry for analysis.

Figure 4:
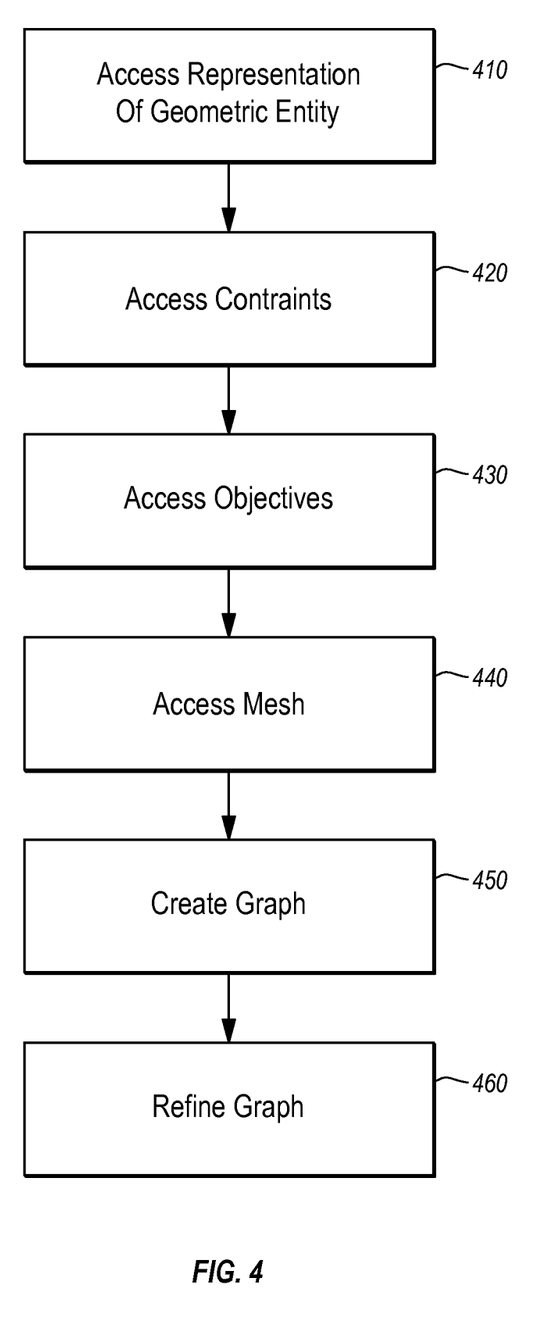
FIG. 4 illustrates a flow chart for an example method of refining a graph representation of a geometry.

FIG. 4 illustrates one such method for refining a graph representation of a geometry for analysis. For example, the method may include accessing a representation of a geometric entity (410). Accessing may include one or more of getting a representation of a geometric entity, setting a representation of a geometric entity, creating a representation of a geometric entity, or computing a representation of a geometric entity. A geometric entity may represent, for example, a jet turbine, bicycle sprocket, or any other geometric entity which may be useful to analyze.

The method may also include accessing a set of constraints for the geometric entity (420). Accessing the set of constraints may include getting, setting, creating, or computing the set of constraints for the geometric entity. Constraints may include size of the geometric entity, shape of the geometric entity, weight of the geometric entity, volume of the geometric entity, or any other constraint which may be useful or necessary in analyzing and determining a final topology for the geometric entity.

The method may also include accessing a set of objectives for the geometric entity (430). Accessing a set of objectives for the geometric entity may include getting a set of objectives for the geometric entity, setting a set of objectives for the geometric entity, creating a set of objectives for the geometric entity, or computing a set of objectives for the geometric entity. For example, an objective could be to minimize the weight or maximize this stiffness of a mechanical part. An objective could be to minimize cost or thermal expansion of a mechanical part.

The method may also include accessing a mesh for the geometric entity (440). Accessing a mesh for the structural entity may include getting a mesh for the geometric entity, setting a mesh for the geometric entity, creating a mesh for the geometric entity, or computing a mesh for the geometric entity. For instance, the mesher 120 may produce a mesh which represents the geometric entity.

The method may also include creating a graph representation of the mesh for the geometric entity (450). The graph representation of the geometric entity may be a binary tree, may be a quad tree, may be an oct tree, and may be a N-tree (where N is a positive finite integer).

The method may also include refining the graph representation of the geometric entity using an optimization algorithm according to the constraints and objectives for the geometric entity (460). The optimization algorithm may be a genetic algorithm. The optimization algorithm may include crossover and may include mutation. The refinement of the graph representation of the geometric entity may proceed until a threshold precision is met. For instance the threshold precision may correspond to the tolerances of a computer numerical control (CNC) machine which can be used to machine parts. In another instance, the threshold precision may correspond to a necessary accuracy for an assembly or structural assemblage.

Figure 5:
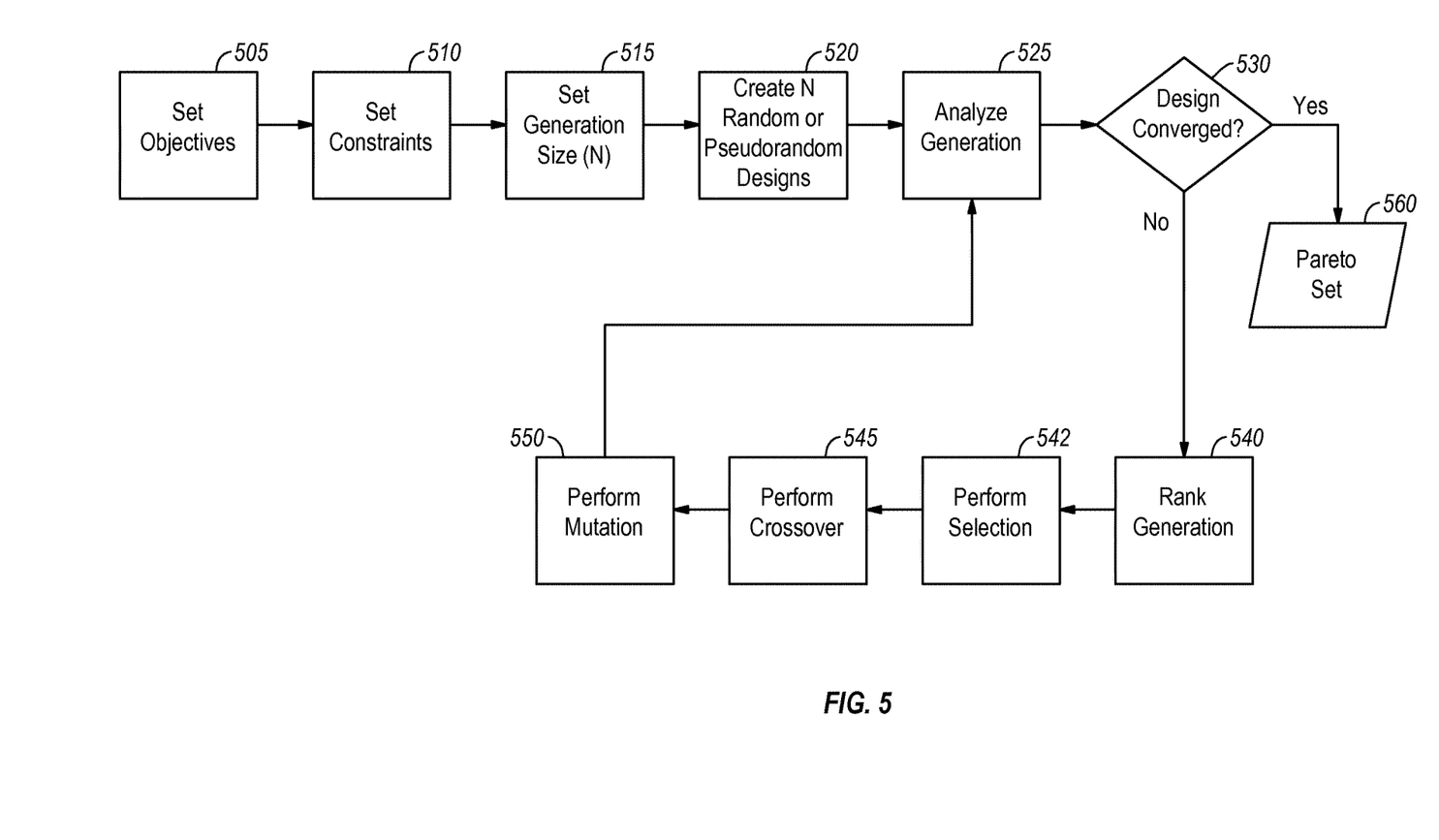
FIG. 5 illustrates the use of a genetic algorithm to optimize a geometric design.

FIG. 5 illustrates the use of a genetic algorithm as an optimization algorithm. Objectives may be set (505) for a design. Constraints may also be set for the design (510). A generation size may be set (515) for the genetic algorithm. (Such a generation size might be N, N being a positive integer.) N random or pseudo-random designs may then be created or generated for analysis (520). Each of the N designs may then be analyzed for "fitness" (525) given the objectives and constraints. It is then checked whether the design has converged (530). Determining if the design has converged may include determining whether a Pareto set has been produced, a Pareto set being an "optimal" set of designs such that no design is better than any other design with respect to all objectives and constraints. If the design has not converged, then the generation can be ranked (540) and a selection of some subset of the N-member generation can be selected (542) based upon the ranking to advance in the iterative process. Crossover (545) and mutation (550) can then be performed on members of the generation selected to advance to produce additional new candidates for analysis which can then be used for another iterative round of analysis (525). Once the design has converged, a Pareto set (representing the optimal designs given the objectives and constraints) may then be output or recorded. An optimal design may be output to a CNC machine, for instance, or, in another example, recorded on computer-readable media for future use or reference.

Figure 6:
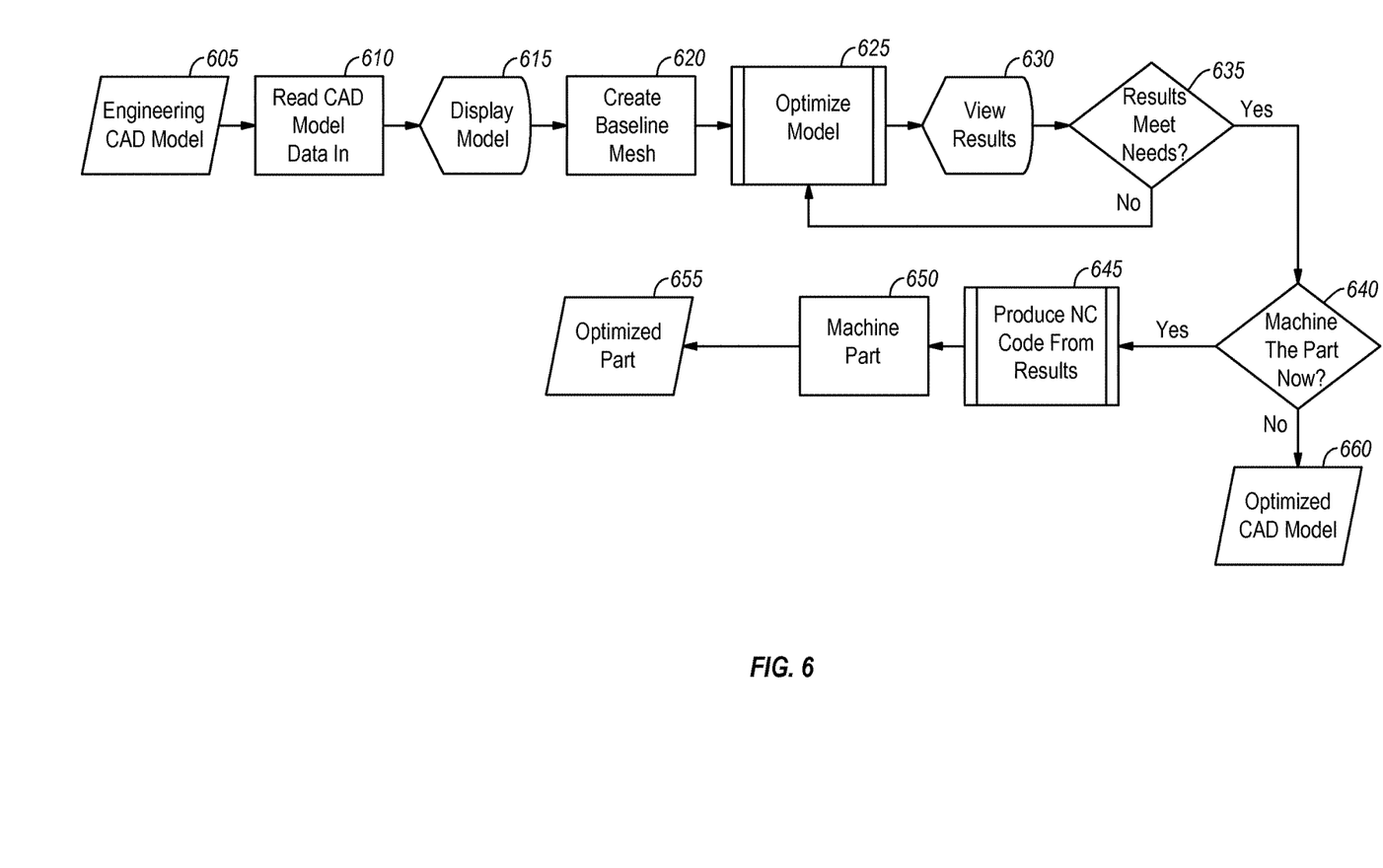
FIG. 6 illustrates a process flow whereby a refined design model may be produced which can be used to machine parts.

FIG. 6 illustrates a process flow employing the technology described herein whereby a design model may be produced which can be used directly to machine parts. An engineering CAD (computer aided design) model (605) may be used as input. The data defining or describing the CAD model may be read (610) or otherwise accessed. In some embodiments, the CAD model may be created by a user using CAD software and, in other embodiments, the CAD model may be generated by an automated process. The CAD model may also be edited at this stage by a user to alter, augment, or otherwise revise a design. The CAD model may be data in a computer readable format which may then be used as input to the meshing and optimization process.

Optionally, the CAD model may be displayed (615). Such a display may include displaying on a graphics display device such as a computer monitor or may include printing a representation of the CAD model on a fixed medium such as paper. A mesh model may then be created, computed, accessed, or otherwise produced (620) which corresponds to the CAD model. The mesh model of the CAD model may be represented by a graph such as a tree graph. The mesh model (which may be a graph such as a tree graph) may then be used as input to optimize the model (625). Optimizing the model (625) may employ the technologies described herein. For example, such optimization may comprise employing methods related to and as described in conjunction with FIGS. 4 and 5.

After the model has been optimized (625), the optimized model may be optionally viewed. As above, viewing may include displaying the model on a graphics display device such as a computer monitor or may include printing a representation of the model on a fixed medium such as paper. A user or automatic method may determine if the optimized model are acceptable (635). If further refinement of the model is desired or is determined to be desirable, the model may return for further refinement and/or optimization (625). If the model is acceptable, it may be determined if the part described by the model should be machined (640). If the part is to be machined, then CNC code may be produced (645) from the optimized model and the part may be machined (650) such as, for example, on a CNC machine to produce the part (655) as specified by the optimized model. If the part is not to be machined, the optimized CAD model (660) may be recorded or stored for future use or reference.

In other embodiments, methods and technologies described herein may be embodied by computer executable instructions which are encoded upon computer storage media and/or encoded upon computer storage devices. Such computer executable instructions, when executed upon one or more computer processors in a computing environment may perform the methods and technologies described herein.

In other embodiments, methods and technologies described herein may be embodied within computing systems. Such computing systems may include one or more computer processors which execute computer-executable instructions and perform the methods and technologies as described herein.

Embodiments of the present invention may comprise or utilize a special purpose or general-purpose computer including computer hardware, such as, for example, one or more processors and system memory, as discussed in greater detail below. Embodiments within the scope of the present invention also include physical and other computer-readable media for carrying or storing computer-executable instructions and/or data structures. Such computer-readable media can be any available media that can be accessed by a general purpose or special purpose computer system. Computer-readable media that store computer-executable instructions are computer storage media (i.e., physical storage devices). Computer-readable media that carry or transmit computer-executable instructions are transmission media (such as network signals and/or wireless signals). Thus, by way of example, and not limitation, embodiments of the invention can comprise at least two distinctly different kinds of computer-readable media: computer storage media (devices) and transmission media.

Computer storage media (devices) includes RAM, ROM, EEPROM, CD-ROM or other optical disk storage, magnetic disk storage or other magnetic storage devices, or any other medium which can be used to store desired program code means in the form of computer-executable instructions or data structures and which can be accessed by a general purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry or desired program code means in the form of computer-executable instructions or data structures and which can be accessed by a general purpose or special purpose computer. Combinations of the above should also be included within the scope of computer-readable media.

Further, upon reaching various computer system components, program code means in the form of computer-executable instructions or data structures can be transferred automatically from transmission media to computer storage media (devices) (or vice versa). For example, computer-executable instructions or data structures received over a network or data link can be buffered in RAM within a network interface module (e.g., a "NIC"), and then eventually transferred to computer system RAM and/or to less volatile computer storage media (devices) at a computer system. Thus, it should be understood that computer storage media (devices) can be included in computer system components that also (or even primarily) utilize transmission media.

Computer-executable instructions comprise, for example, instructions and data which, when executed at a processor, cause a general purpose computer, special purpose computer, or special purpose processing device to perform a certain function or group of functions. The computer executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for refining a graph representation of a mechanical structure to be manufactured, the method performed in a computing environment comprising one or more computer processors and system memory, the method performed by executing computer instructions upon the one or more processors, the method comprising:
    accessing from computer memory a representation of a mechanical structure under design for manufacturing;
    accessing a set of constraints for the mechanical structure;
    accessing a set of objectives for the mechanical structure, the set of objectives including an available precision for manufacture of the mechanical structure and including at least one of strength and material volume for a final design of the mechanical structure;
    accessing a mesh for the mechanical structure;
    creating a graph representation of the mesh for the mechanical structure;
    refining the graph representation of the mechanical structure using an optimization algorithm according to the constraints and objectives for the mechanical structure such that the final design of the mechanical structure is produced and meets the constraints and objectives including the at least one of strength and material volume for the final design of the mechanical structure and the available precision for manufacture; and
    saving the refined graph representation of the mechanical structure in computer memory for use in manufacturing the mechanical structure.

2. The method according to claim 1 wherein the graph is a binary tree.

3. The method according to claim 1 wherein the graph is a quad tree.

4. The method according to claim 1 wherein the graph is an oct tree.

5. The method according to claim 1 wherein the graph is an N-tree, N being a finite integer.

6. The method according to claim 1 wherein the graph vertices have various numbers of children and the graph may have cycles.

7. The method according to claim 1 wherein the optimization algorithm is a genetic algorithm.

8. The method according to claim 7 wherein the genetic algorithm comprises crossover and/or mutation.

9. The method according to claim 1 wherein the optimization algorithm comprises one or more of ant colony optimization, some other particle swarm intelligence optimization method, branch and bound, some other combinatorial optimization algorithm, or other graph search method.

10. The method according to claim 1 wherein the refinement proceeds until a threshold precision is met.

11. The method according to claim 10 wherein the threshold precision corresponds to the tolerances of a computer numerical control (CNC) machine.

12. A computer program product for refining a graph representation of a mechanical structure to be manufactured, the computer program product comprising non-transitory computer readable storage media having encoded thereon computer executable instructions which, when executed upon one or more computer processors, performs a method comprising:
  accessing from computer memory a representation of a mechanical structure under design for manufacturing;
  accessing a set of constraints for the mechanical structure;
  accessing a set of objectives for the mechanical structure, the set of objectives including an available precision for manufacture of the mechanical structure and including at least one of strength and material volume for a final design of the mechanical structure;
  accessing a mesh for the mechanical structure;
  creating a graph representation of the mesh for the mechanical structure;
  refining the graph representation of the mechanical structure using an optimization algorithm according to the constraints and objectives for the mechanical structure such that the final design of the mechanical structure is produced and meets the constraints and objectives including the at least one of strength and material volume for the final design of the mechanical structure and the available precision for manufacture; and
  saving the refined graph representation of the mechanical structure in computer memory for use in manufacturing the mechanical structure.

13. The computer program product according to claim 12 wherein the graph is a quad tree.

14. The computer program product according to claim 12 wherein the graph is an N-tree, N being a finite integer.

15. The computer program product according to claim 12 wherein the graph vertices have various numbers of children and the graph may have cycles.

16. The computer program product according to claim 12 wherein the optimization algorithm is a genetic algorithm.

17. A system for refining a graph representation of a mechanical structure to be manufactured, the system comprising one or more computer processors executing instructions for performing a method comprising:
  accessing from computer memory a representation of a mechanical structure under design for manufacturing;
  accessing a set of constraints for the mechanical structure;
  accessing a set of objectives for the mechanical structure, the set of objectives including an available precision for manufacture of the mechanical structure and including at least one of strength and material volume for a final design of the mechanical structure;
  accessing a mesh for the mechanical structure;
  creating a graph representation of the mesh for the mechanical structure;
  refining the graph representation of the mechanical structure using an optimization algorithm according to the constraints and objectives for the mechanical structure such that the final design of the mechanical structure is produced and meets the constraints and objectives including the at least one of strength and material volume for the final design of the mechanical structure and the available precision for manufacture; and
  saving the refined graph representation of the mechanical structure in computer memory for use in manufacturing the mechanical structure.

18. The system according to claim 17 wherein the optimization algorithm is a genetic algorithm.

19. The system according to claim 17 wherein the refinement proceeds until a threshold precision is met.

20. The system according to claim 17 wherein the threshold precision corresponds to the tolerances of a computer numerical control (CNC) machine.

* * * * *